United States Patent [19]

Hauser

[11] Patent Number: 4,778,097
[45] Date of Patent: Oct. 18, 1988

[54] ULTRASONIC WIRE BONDING TOOL

[76] Inventor: John G. Hauser, 9608 Toledo Rd., Bloomington, Minn. 55437

[21] Appl. No.: 938,178

[22] Filed: Dec. 4, 1986

[51] Int. Cl.$^4$ .............................................. B23K 3/02
[52] U.S. Cl. ..................... 228/44.7; 228/54; 228/1.1
[58] Field of Search ................... 228/44.7, 54, 4.5, 1.1

[56] References Cited

U.S. PATENT DOCUMENTS

| | | | |
|---|---|---|---|
| 3,593,906 | 7/1971 | Hug ...................................... | 228/1.1 |
| 3,711,341 | 1/1973 | Joshi et al. ............................ | 228/1.1 |
| 3,934,783 | 1/1976 | Harrison .............................. | 228/1.1 |
| 3,971,499 | 7/1976 | Goodrich et al. ..................... | 228/54 |
| 4,030,657 | 7/1977 | Scheffer ............................... | 228/1.1 |
| 4,063,673 | 12/1977 | Gaicki ................................. | 228/1.1 |

FOREIGN PATENT DOCUMENTS

| | | | |
|---|---|---|---|
| 0096643 | 7/1980 | Japan .................................... | 228/54 |
| 0151344 | 11/1980 | Japan .................................... | 228/179 |

OTHER PUBLICATIONS

"Ultrasonic Bonding Tools", Jan. 1985.

Primary Examiner—Nicholas P. Godici
Assistant Examiner—Karen Skillman

[57] ABSTRACT

A tool for use in ultrasonically bonding a wire to a metal surface has a tip having a compound curved channel having a central concave surface and a peripheral non-convex surface along each edge of the central surface. The central surface has a cross-sectional shape similar to that of a portion of the wire's cross section. The total cross-sectional area of the channel should be at least 50% and less than 100% of the wire's cross-sectional area. In a preferred embodiment, the cross section of the central surface is an arc of a circle approximately centered on a line drawn between the outer edges of the peripheral surfaces of the channel. The preferred embodiment also has a beveled surface intersecting an end of the channel to provide a gradual transition for the wire shape from the bond to the undistorted wire.

The tool when used to bond an appropriate wire by an ultrasonic bonding machine produces a wire whose outer shape in the bond area conforms to the shape of this tool's channel. The bond area attaches the wire to a metal pad with superior pull strength and electrical contact characteristics.

15 Claims, 1 Drawing Sheet

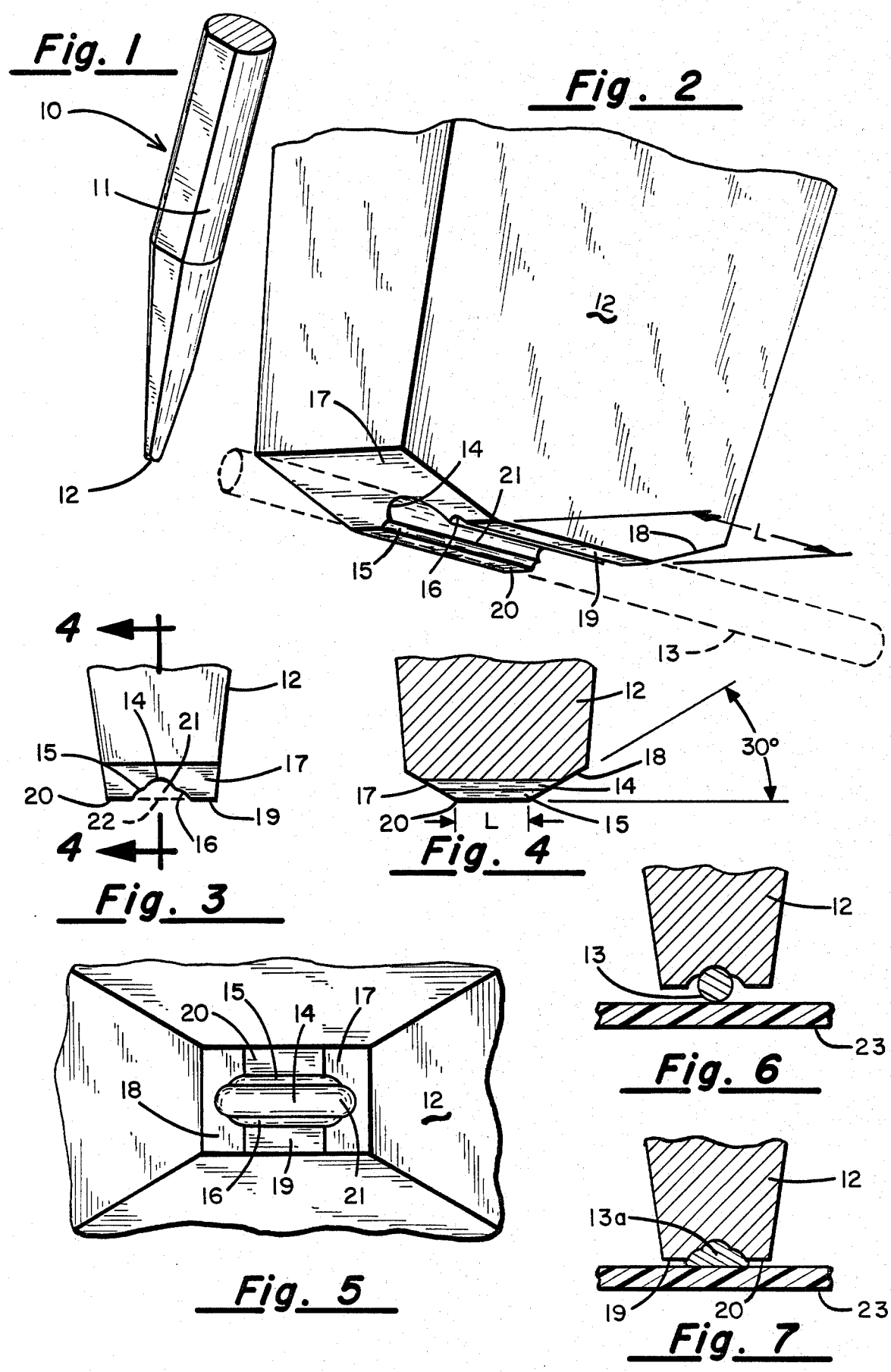

4,778,097

ULTRASONIC WIRE BONDING TOOL

BACKGROUND OF THE INVENTION

A useful technique for permanently attaching wire conductors to conductive pads involves so-called ultrasonic bonding. A machine to perform this operation includes a transducer-mounted tool having a grooved tip by which the wire is pressed against the pad to which it is to be bonded. The tip and wire are vibrated by the transducer either transversely or parallel to the wire's axis at high frequency with a very short excursion. It is believed by some that heat generated by the resulting vibrational friction causes the metallic conductor to fuse to the pad. Others disagree as to the accuracy of this theory. At any rate, when properly executed ultrasonic bonding forms a strong, low-resistance connection between the wire and the pad relatively cheaply and quickly, compared to soldering or other bonding techniques. The process is discussed in various places, U.S. Pat. No. 3,690,538 (Gaiser et al.) being one.

The two important physical characteristics of a good wire to pad bond, ultrasonically created or otherwise, are contact resistance and pull strength. High pull strength is valuable since it allows the joint to better survive rough handling during both assembly and use. In ultrasonic bonding, pull strength is limited both by deformation of the wire during the bonding operation which weakens the wire and by the inherent strength of the bond itself. Therefore, one measure of the effectiveness of a particular bond is its actual pull strength. Contact resistance is usually very repeatable once a manufacturing operation has stabilized.

PRIOR ART STATEMENT

The most relevant prior art known is U.S. Pat. No. 3,128,649 which shows an ultrasonic bonding die having a V-shaped groove for holding the wire during bonding, and the aforementioned patent 3,690,538. Other pertinent references include U.S. Pat. Nos. 3,347,442; 3,593,906; 3,711,341; 3,934,783; 4,030,657; and 4,063,673.

BRIEF DESCRIPTION OF THE INVENTION

A superior ultrasonic bond is created in my invention by use of a special bonding tool having a tip made of a hard, strong material such as tungsten carbide. Each such tool is designed for use with a wire of predetermined cross section, both in shape and dimensions. The tip of the tool has a compound curved cylindrical channel or groove for holding the wire against the pad. In one embodiment the term "cylindrical" refers to a the channel cross section which does not change for at least a portion of the channel's length, although a wide variety of channel shapes are suitable. The channel has a central concave surface whose cross-sectional shape approximates a minor portion of the wire's cross-sectional shape both as to geometry and as to dimensions. It is quite important that there be a slight interference fit between the central surface and the wire so that the wire is firmly held thereby, and the term "approximate" is used to describe this condition. By "minor" is meant that this surface contacts less than half of the wire's circumference. When insulated wire is to be bonded, the central concave surface must be sufficiently shallow relative to the insulation thickness and the surrounding surfaces of the tip through which the channel cuts, to permit the conductor to project past these surfaces and mechanically contact the pad during the bonding operation.

A particular feature of my invention is the presence of a pair of nonconvex surfaces forming part of the compound curved cylindrical channel, each nonconvex surface peripheral to and intersecting one edge of the central concave surface. Each intersects one edge of the central surface and extends toward and intersects the tip plane. This combination of central concave surface and nonconvex peripheral surfaces is what is meant by the term "compound curved" when referring to the channel in this context. The bonding operation causes the wire shape to be molded to conform to the interior shape of the compound curved cylindrical channel. This improves the bond and the bonding operation in a number of important respects compared to a conventional bonding tool channel which has a simply curved groove.

Because it is very important that the tip plane not contact the pad during bonding, the total area of the channel cross section including these nonconvex surfaces must be less than the cross-sectional area of the wire. That is, at the end of the bonding operation, there must still be a portion of the wire outside the channel, including its nonconvex surfaces adjacent the central convex surface. In fact it is preferred that the total area of the channel cross section be around approximately 50% to 70% of the wire's cross-sectional area.

Another feature of the invention is a beveled surface extending along the axis of the channel and angled away therefrom and the surfaces adjacent the channel itself, and intended to lie adjacent the wire during bonding. During the bonding, this beveled surface provides a gradual transition from the bond area to the normal wire shape. This avoids weakness in the conductor itself caused by an abrupt change in conductor cross section.

Accordingly, one purpose of this invention is to increase the bond strength of ultrasonic bonds.

A second purpose is to avoid necking or stress concentrations in the conductor.

Another purpose is to increase the pull strength exhibited by the bonded wire.

Still another purpose is to improve the reliability with which such bonding takes place, particularly in a manufacturing situation.

BRIEF DESCRIPTION OF THE DRAWINGS

FIG. 1 is a perspective view of a preferred embodiment of an ultrasonic bonding tool incorporating the invention.

FIG. 2 is a perspective drawing of the tip of the tool of the invention, greatly enlarged, with a wire positioned in the channel as it would be for bonding.

FIG. 3 is a projective view of the tip normal to the axis of the channel.

FIG. 4 is a section of the tip shown in FIG. 3 perpendicular to the surface surrounding the channel of the preferred embodiment.

FIG. 5 is a projective view of the tip surface showing the true shape of the two flat surfaces surrounding and parallel to the axis of the channel therein. FIGS. 3–5 are spatially oriented on the paper as projections from each other.

FIG. 6 is a section view of the tip normal to the axis of the channel showing the wire to be bonded and the pad to which the wire is to be bonded correctly positioned to commence bonding.

FIG. 7 is a section view of the tip normal to the axis of the channel and through a bond just after creating it using the wire shown in FIG. 6.

DESCRIPTION OF THE PREFERRED EMBODIMENT

FIG. 1 shows the tip of the tool of the invention much magnified. The invention has been successfully used to bond 2.3 mil (0.584 mm.) O. D. wire. However, the principles involved and explained herein are of general application for bonding a variety of wire sizes. Turning first to FIG. 1, the tool 10 for implementing the improved ultrasonic bonding process is shown greatly enlarged. One actual embodiment of tool 10 has an overall length of less than 0.5 inch (1.3 cm.) and is used with a 2.3 mil (0.0584 mm.) O. D. wire (by way of comparison, less than the diameter of a human hair). Tool 10 has a shank 11 which tapers to the tip 12 where the invention is embodied. The circle surrounding the tip 12 and the lead line indicates that the tip 12 is shown further enlarged in FIGS. 2-7.

The greatly enlarged perspective view of tip 12 in FIG. 2 shows the features of the invention with a wire 13 shown in outline positioned as it should be relative to the channel of the invention at the start of a bonding operation. FIGS. 3-5 show projective views of the tip, further clarifying its geometry. The views of FIGS. 3-5 are spatially related to each other in that they are projections from each other as shown. Channel 21 has a compound, curved cylindrical shape comprising a central concave surface 14 whose cross-sectional shape approximates a minor portion of the cross section of the wire to be bonded. As explained above, "minor portion of the cross section" is to be interpreted to mean that less than half of the periphery's cross section is engaged with or abuts channel 14. Thus for the typical wire 13 whose cross section is circular, surface 14 is a portion of a circular cylinder subtending less than 180 degrees. The term "approximates" is used to accomodate the well-known requirement that a slight interference fit is necessary between the wire when positioned in the channel at the start of bonding to assure good mechanical connection between tool 10 and wire 13. This assures efficient transmission of the motion of tool 10 to wire 13 so that it is vibrated strongly against the pad 23 (see discussion for FIGS. 6 and 7) to which the wire 13 is to be bonded. A last definition needed is for the term "cylindrical" which in this context indicates that channel 21 has an invariant cross section over at least a part of its length, L as shown in FIGS. 2 and 4.

The channel 21 further comprises a pair of peripheral, nonconvex surfaces 15 and 16 each of which intersect an edge of central surface 14. Surfaces 15 and 16 may have a finite radius of curvature somewhat larger than that of the central surface 14, or may be flat planes. The total area of the channel cross section, i.e. the area in FIG. 3 bounded by the peripheral surfaces 15 and 16, central surface 14, and dashed line 22 across the mouth of channel 21 must be less than the cross-sectional area of the wire, but preferably at least 50%-70% of this area. This is so that flat surfaces 19 and 20 will not contact the pad 23 when bonding has been completed. (Note the clearance between pad 23 and surfaces 19 and 20 shown in FIG. 7.) The combination of a concave central surface 12 and nonconvex peripheral surfaces 15 and 16 is what is meant by the term "compound, curved cylindrical surface".

Beveled surfaces 17 and 18 provide a smooth transition for the wire 13 from the bond area to the undistorted. While the bevel angle shown is 30 degrees (interior included angle of 150 degrees) which is preferred, other angles may work better for other sizes of wires and other aspects of the bonding operation. In certain circumstances, the beveled surfaces may be curved and blend smoothly with channel 21 and flat surfaces 19 and 20.

In operation, tool 10 is clamped by a set screw or other means in the chuck of a conventional ultrasonic bonding machine. Each wire 13 to be bonded is positioned in the channel as shown in FIGS. 2 and 6, and the bonding machine is caused to press the wire 13 firmly against pad 23 while vibrating tool 10 either transversely or along the wire's length. This is believed to generate heat which causes the wire 13 to fuse with pad 23. During the operation, the wire 13 is molded to a cross section as shown in FIG. 7. One reason that superior bond strength results from using a tool 10 with a tip 12 having the channel 14 is that a greater bond area results. The nonconvex shape of peripheral surfaces 15 and 16 molds the wire 13 into a shape whose bond characteristics are strong and reliably reproduceable.

As discussed above, it is important to select the area of the channel 21 cross section to be less that the wire's cross section, so that at the end of the bonding operation, surfaces 19 and 20 do not contact pad 23. One reason for this is that the pad 23 surface may be damaged otherwise. Another is that the tool will rub against pad 23 and itself be abraded. Quality of the bond may be also affected. It is difficult to set the cross-sectional area of channel 21 to be less than 50% of the area of wire 13 and still encircle wire 13 sufficiently to keep wire 13 within channel 14 during the bonding operation, hence the 50%-70% preferred range mentioned earlier. At the same time, of course, there must be sufficient area contributed by peripheral surfaces 15 and 16 to allow wire 13 to expand along the surface of pad 23 in an amount sufficient to substantially increase the footprint of the bond area on pad 23. It should be noted in regard to this discussion that the wire shape 13a shown in FIG. 7 has a cross-sectional area essentially identical to that of the wire 13 before bonding shown in FIG. 6. That is, wire 13 undergoes no volumetric compression during the operation, nor is any wire material extruded from beneath tip 12.

Use of the tool 10 in an appropriate ultrasonic bonding machine produces in wire 13 a bond area 13a whose outer shape closely conforms to the shape of the channel 21 in tool 10. This bond area 13a has superior pull strength in attaching wire 13 to pad 23. Furthermore, the electrical contact between wire 13 and pad 23 is on the average of lower resistance than those formed by prior art bonding tools. The bonds formed have greater repeatability using tool 10. The shape of the channel reduces the amount of stretching which the area of the wire 13 in contact with the channel 21 undergoes, preventing it being cracked or torn. Thus the wire 13 is protected from the air afterwards, and there is much less chance that pieces of the insulation can contaminate the surroundings. This latter aspect is important when bonding leads from the magnetic transducers which are used in a disk memory whose interior must be kept perfectly clean to prevent disk crashes.

The use of this tool also increases the pressure between the wire and the pad during the bonding process because the peripheral channels 15 and 16 limit the spreading of the wire 13 during bonding. This is because the area of the footprint of the wire 13 on the pad is kept as small as possible by the peripheral channels 15 and 16. Furthermore, the footprint area is very consistent from one bond to the next even though there are unavoidable small variations in the time for the bonding operation and the force with which the tool presses the wire on the pad. Accordingly, I have found that use of this tool provides substantial advantages over these prior art bonding tools.

This tool has been used successfully in a particular bonding operation for wire having a 2.3 mil O.D. and polyurethane insulation 0.16 mil thick in the area where the bond is formed. It must be understood that the conductive core for such a wire must extend substantially past the plane of surfaces 19 and 20, represented by dashed line 22 in FIG. 3, when wire 13 is correctly designed for a channel 21 having particular preselected dimensions, so that the conductive core intersects pad 23 well before surfaces 19 and 20 reach their final position relative to the surface of pad 23. This permits the conductive core to penetrate the insulating cover during the operation and form a reliable bond during each operation. Because of the difficulty of stripping such small wires and thin insulation, I in fact prefer to bond with the insulation in place when using the above described wire and wire similar to it.

What I claim is:

1. A tool for use in ultrasonic bonding a metal wire of predetermined cross section to a metal surface and having a tip with a compound curved cylindrical channel extending the length of said tip for pressing the wire when longitudinally placed in said channel against the surface, said channel having a central concave surface whose cross-sectional shape approximates a minor portion of the wire's cross-sectional shape, and said channel further including a pair of peripheral non-convex surfaces each intersecting one edge of the central concave surface, the total area of the channel cross section being less than the cross-sectional area of the wire.

2. The tool of claim 1 wherein the wire has a circular cross section and wherein the central surface cross section is approximately the arc of a circle.

3. The tool of claim 2 wherein the circle defining the central surface cross section is centered approximately on the line connecting the exterior edges of the peripheral surfaces.

4. The tool of claim 3 wherein the area of the channel cross section is at least approximately 50% of the wire's cross-sectional area.

5. The tool of claim 2 wherein the area of the channel cross section is at least approximately 50% of the wire's cross-sectional area.

6. The tool of claim 3 wherein the channel is bilaterally symmetrical.

7. The tool of claim 1 wherein the channel is bilaterally symmetrical.

8. The tool of claim 1 wherein the tip includes a flat surface through which the channel cuts, said tip including a beveled surface intersecting an end of the channel.

9. The tool of claim 8 wherein the beveled surface is flat and makes an inside included angle of approximately 150 degrees with the tip's flat surface.

10. The tool of claim 8 wherein the beveled surface is flat.

11. The tool of claim 1 wherein the area of the channel cross section is at least approximately 50% of the wire's cross-sectional area.

12. The tool of claim 1 wherein the peripheral surface cross sections each comprise circular arcs.

13. The tool of claim 12 wherein the peripheral surfaces have a radius of curvature larger than that of the central surface.

14. A wire bonded to a metal pad surface and having a bond area whose outer surface conforms to the shape of the channel in the tip of the tool of claim 13.

15. A wire bonded to a metal pad surface and having a bond area whose outer surface conforms to the shape of the channel in the tip of the tool of claim 1.

* * * * *